United States Patent
Nguyen et al.

(10) Patent No.: US 11,063,002 B2
(45) Date of Patent: *Jul. 13, 2021

(54) METHODS RELATED TO SHIELDED MODULE HAVING COMPRESSION OVERMOLD

(71) Applicant: SKYWORKS SOLUTIONS, INC., Woburn, MA (US)

(72) Inventors: Hoang Mong Nguyen, Fountain Valley, CA (US); Luis Eduardo Herrera, Mexicali (MX); Sergio Joaquin Gonzalez Flores, Mexicali (MX); Matthew Sean Read, Foothill Ranch, CA (US); Anthony James Lobianco, Irvine, CA (US); Heliodoro Osuna, Mexicali (MX)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/734,356

(22) Filed: Jan. 5, 2020

(65) Prior Publication Data

US 2020/0258845 A1 Aug. 13, 2020

Related U.S. Application Data

(63) Continuation of application No. 16/029,593, filed on Jul. 7, 2018, now Pat. No. 10,529,669, which is a
(Continued)

(51) Int. Cl.
*H01L 23/552* (2006.01)
*H01L 21/56* (2006.01)
(Continued)

(52) U.S. Cl.
CPC .......... *H01L 23/552* (2013.01); *H01L 21/56* (2013.01); *H01L 21/566* (2013.01);
(Continued)

(58) Field of Classification Search
CPC ........ H01L 24/29; H01L 24/43; H01L 24/49; H01L 24/85; H01L 23/29; H01L 23/293;
(Continued)

(56) References Cited

U.S. PATENT DOCUMENTS 7,411,278 B2 * 8/2008 Wen .................... H01L 23/3107
257/659
9,461,355 B2 * 10/2016 Nair .................... H01Q 1/2291
(Continued)

FOREIGN PATENT DOCUMENTS

| CN | 101681901 A | 3/2010 |
|---|---|---|
| CN | 101681901 B | 7/2011 |
| JP | 2006256195 | 9/2006 |

OTHER PUBLICATIONS

International Search Report and Written Opinion for PCT/US2016/034315 dated Sep. 28, 2016.

*Primary Examiner* — Monica D Harrison
(74) *Attorney, Agent, or Firm* — Chang & Hale LLP

(57) ABSTRACT

A method for fabricating a radio-frequency (RF) module is disclosed, the method including forming or providing a first assembly that includes a packaging substrate and an RF component mounted thereon, the first assembly further including one or more shielding-wirebonds formed relative to the RF component, forming an overmold over the packaging substrate to substantially encapsulate the RF component and the one or more shielding-wirebonds, the overmold formed by compression molding, and forming a conductive
(Continued)

layer on an upper surface of the overmold such that the conductive layer is in electrical contact with some or all of the shielding-wirebonds.

13 Claims, 9 Drawing Sheets

Related U.S. Application Data continuation of application No. 15/165,494, filed on May 26, 2016, now Pat. No. 10,290,585.

(60) Provisional application No. 62/168,872, filed on May 31, 2015.

(51) Int. Cl.
*H01L 23/49* (2006.01)
*H01L 23/66* (2006.01)
*H01L 23/31* (2006.01)
*H01L 23/29* (2006.01)
*H01L 23/00* (2006.01)

(52) U.S. Cl.
CPC ........ *H01L 23/293* (2013.01); *H01L 23/3121* (2013.01); *H01L 23/49* (2013.01); *H01L 23/66* (2013.01); *H01L 24/29* (2013.01); *H01L 24/43* (2013.01); *H01L 24/49* (2013.01); *H01L 24/85* (2013.01); *H01L 21/561* (2013.01); *H01L 24/48* (2013.01); *H01L 2224/48091* (2013.01); *H01L 2224/48227* (2013.01); *H01L 2224/73215* (2013.01); *H01L 2224/85* (2013.01); *H01L 2224/97* (2013.01); *H01L 2924/00014* (2013.01); *H01L 2924/181* (2013.01); *H01L 2924/19107* (2013.01)

(58) Field of Classification Search
CPC ... H01L 23/31; H01L 23/312; H01L 23/3121; H01L 23/49; H01L 23/55; H01L 23/552; H01L 23/66; H01L 21/56; H01L 21/566; H01L 24/48; H01L 2224/85; H01L 2224/97
USPC ........................................................ 257/659
See application file for complete search history.

(56) References Cited

U.S. PATENT DOCUMENTS

| 10,529,669 B2 * | 1/2020 | Nguyen ................. H01L 23/66 |
| 2008/0014678 A1 | 1/2008 | Howard et al. |
| 2008/0278255 A1 | 11/2008 | Harvey |
| 2008/0278256 A1 | 11/2008 | Harvey |
| 2009/0189310 A1 | 7/2009 | Takase et al. |
| 2010/0062572 A1 | 3/2010 | Kuro et al. |
| 2013/0335288 A1 | 12/2013 | Read et al. |
| 2015/0126139 A1 | 5/2015 | Chen et al. |
| 2016/0043813 A1 | 2/2016 | Chen et al. |
| 2017/0025362 A1 | 1/2017 | Nguyen et al. |

* cited by examiner

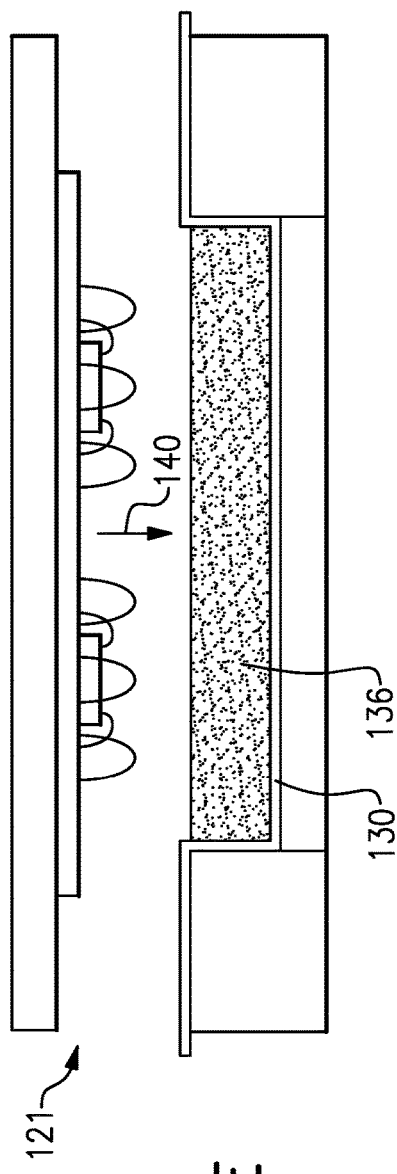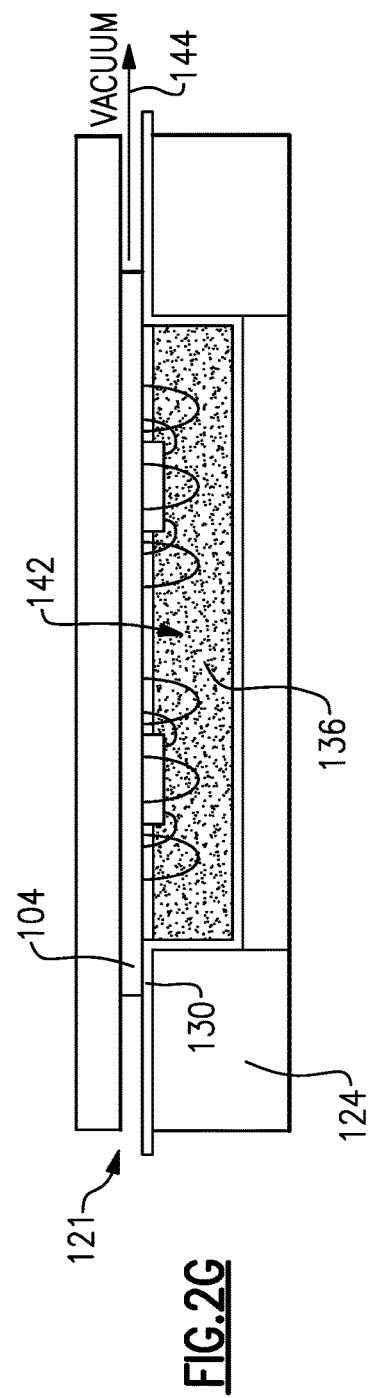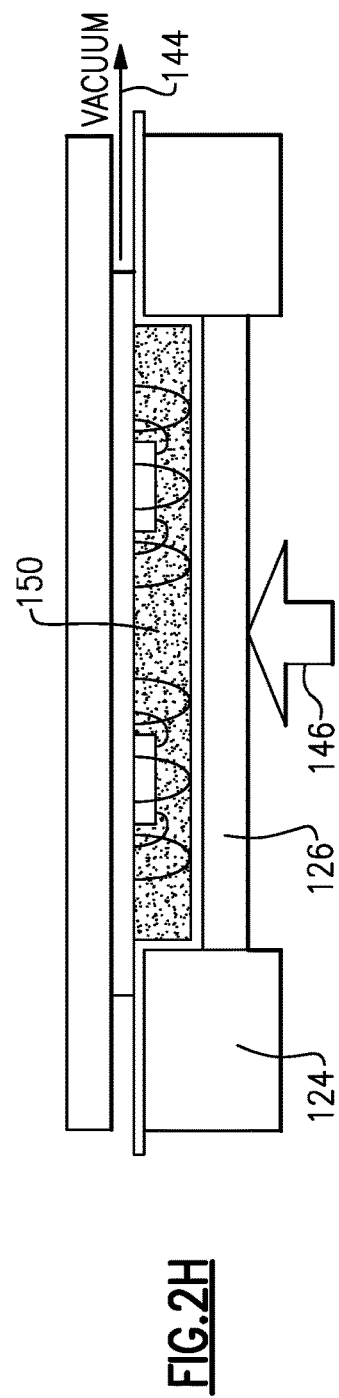

METHODS RELATED TO SHIELDED MODULE HAVING COMPRESSION OVERMOLD

CROSS-REFERENCE TO RELATED APPLICATION(S)

This application is a continuation of U.S. patent application Ser. No. 16/029,593, filed Jul. 7, 2018, entitled "SHIELDED MODULE HAVING COMPRESSION OVERMOLD," which is a continuation of U.S. patent application Ser. No. 15/165,494, filed May 26, 2016, entitled "SHIELDED MODULE HAVING COMPRESSION OVERMOLD," which claims priority to U.S. Provisional Application No. 62/168,872, filed May 31, 2015, entitled "SHIELDED MODULE HAVING COMPRESSION OVERMOLD," the disclosure of each of which is hereby expressly incorporated by reference herein in its entirety.

BACKGROUND

Field

The present disclosure relates to module shielding technology for various semiconductor devices.

Description of the Related Art

Existing techniques for forming mold caps on packaged semiconductor parts have several limitations and disadvantages. One such existing technique is transfer mold technology, which involves pushing fluid resin into one end of a cavity containing the parts to be capped with mold compound. This technique is prone to trapped air pockets resulting from imbalanced flow, uneven resin distribution, and occasionally damage or warpage to wires on the semiconductor parts. Accordingly a safer and more efficient technique for forming mold caps on packaged semiconductor parts is desired.

SUMMARY

According to some implementations, the present disclosure relates to a method for fabricating a radio-frequency (RF) module, including forming or providing a first assembly that includes a packaging substrate and an RF component mounted thereon, the first assembly further including one or more shielding-wirebonds formed relative to the RF component, and forming an overmold over the packaging substrate to substantially encapsulate the RF component and the one or more shielding-wirebonds, the overmold formed by compression molding that includes reducing a volume of melted resin in a direction having a component perpendicular to a plane defined by the packaging substrate.

In some embodiments, the forming of the overmold includes mounting the first assembly to an upper molding plate to yield a second assembly in which the RF component and the one or more shielding-wirebonds are facing downward of the upper molding plate.

In some embodiments, the forming of the overmold further includes lining a molding cavity with a release film. In some embodiments, forming of the overmold further includes lowering the second assembly into the molding cavity having the volume of melted resin.

In some embodiments, the lowering of the second assembly includes a substantially vertical motion to reduce or eliminate lateral sweeping of the one or more shielding-wirebonds.

In some embodiments, the forming of the overmold further includes applying vacuum to the volume of melted resin. In some embodiments, the vacuum remains applied during at least a portion of the reduction of the volume of melted resin.

In some embodiments, the reducing of the volume of melted resin includes moving a floor of the molding cavity upward by an amount resulting in a portion of the one or more shielding-wirebonds engaging the release film. In some embodiments, the portion of the one or more shielding-wirebonds deforms the release film upon the engagement to thereby reduce lateral movement of the one or more shielding-wirebonds during the reduction of the volume of melted resin.

In some embodiments, the forming of the overmold further includes separating the second assembly from the molding cavity, the separated second assembly including the compression molded overmold. In some embodiments, the method further includes removing the first assembly with the compression molded overmold from the upper molding plate.

In some embodiments, the method further includes forming a conductive layer on an upper surface of the overmold such that the conductive layer is in electrical contact with some or all of the shielding-wirebonds. In some embodiments, forming the conductive layer includes depositing a metal-based layer on the upper surface of the overmold.

In some embodiments, a packaged radio-frequency (RF) module is disclosed, which includes a packaging substrate configured to receive one or more components. In some embodiments, the packaging substrate includes a ground plane, an RF component mounted on the packaging substrate and one or more shielding-wirebonds implemented on the packaging substrate and relative to the RF component, each of the one or more shielding-wirebonds electrically connected to the ground plane. In some embodiments, a compression overmold structure is implemented over the packaging substrate to substantially encapsulate the RF component and the one or more shielding-wirebonds, and a conductive layer implemented over the compression overmold structure to be in electrical contact with an upper portion of at least one of the one or more shielding-wirebonds, such that the conductive layer is electrically connected to the ground plane.

In some embodiments, an upper portion of the compression overmold structure of the RF module is removed by one or more ablation techniques to expose upper portions of the shielding-wirebonds before implementation of the conductive layer.

In some embodiments, the conductive layer of the RF module is a metal-based layer. In some embodiments, the packaging substrate of the RF module is mounted to an upper molding plate.

In some embodiments, each shielding-wirebond of the RF module is in an arch shape. In some embodiments, each shielding-wirebond of the RF module is in an asymmetrical arch shape. In some embodiments, each shielding-wirebond is a single wire with one end on the packaging substrate and the other end in electrical contact with the conductive layer.

In some embodiments, a wireless device is disclosed, including an antenna and a module in communication with the antenna, configured to facilitate either or both of transmission and reception of RF signals through the antenna. In some embodiments, the module includes a packaging substrate having a ground plane, and an RF component mounted on the packaging substrate, one or more shielding-wirebonds implemented on the packaging substrate and relative to the RF component, such that each of the one or more shielding-wirebonds is electrically connected to the ground plane. In some embodiments, the module further includes a compression overmold structure implemented over the packaging substrate to substantially encapsulate the RF component and the one or more shielding-wirebonds, and a conductive layer implemented over the compression overmold structure to be in electrical contact with an upper portion of each of the one or more shielding-wirebonds, such that the conductive layer is electrically connected to the ground plane.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIGS. 2A-2I show various stages of a process that can be utilized to form an overmold structure utilizing compression molding in accordance with some implementations.

DETAILED DESCRIPTION OF THE EMBODIMENTS

The headings provided herein, if any, are for convenience only and do not necessarily affect the scope or meaning of the claimed invention.

Described herein are examples of devices and methods related to a shielded module having a compression-molded structure such as an overmold. Such a module can include radio-frequency (RF) shielding facilitated by, for example, shielding-wirebonds. Additional details concerning such shielding-wirebonds can be found, for example, in Appendix A of U.S. Provisional Application No. 62/168,872 filed May 31, 2015, entitled SHIELDED MODULE HAVING COMPRESSION OVERMOLD, which is expressly incorporated by reference in its entirely, and which is to be considered part of the specification of the present application.

Figure 1:
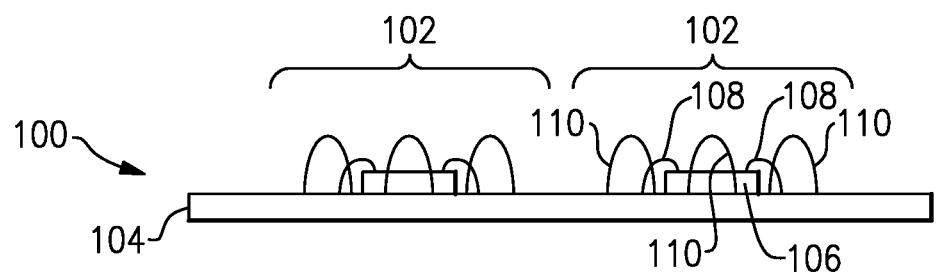
FIG. 1 shows a side view of a partially completed panel having a packaging substrate in accordance with some implementations.

FIG. 1 shows a side view of a partially completed panel 100 having a packaging substrate 104. Such a packaging substrate 104 can include, for example, a laminate substrate. Formed or mounted on such a packaging substrate 104 are two example individual units 102 that will become separate individual packaged modules. It will be understood that there may be more or less than the two example units 102 shown in FIG. 1. In some embodiments, a unit 102 is an assembly of one or more semiconductor devices, electrical connection components and RF shielding components.

Each unit 102 can include an RF component 106, and such an RF component 106 can be electrically connected to the packaging substrate 104 and/or another component (not shown) through one or more connection-wirebonds 108. It will be understood that the RF component 106 can also be connected to the packaging substrate 104 through other types of connections, such as a ball-grid array. The RF component 106 can be, for example, a die having an RF circuit, a passive device configured to facilitate RF operation, etc.

Each unit 102 can also include one or more shielding-wirebonds 110 positioned relative to the RF component 106. Such shielding-wirebond(s) can allow shielding between the RF component 106 and another location within the individual unit 102 or a location external to the individual unit 102 (when completed and operating as a functional individual module). Accordingly, it will be understood that shielding-wirebond(s) as described herein can be implemented to, for example, partially or fully surround the RF component 106, be configured such that one or more shielding-wirebonds is/are positioned relative to the RF component 106 to provide tuned shielding, or any combination thereof.

In many module packaging applications, it is desirable to encapsulate the individual units 102, with for example, an overmold structure. Such an overmold structure can, for example, seal and protect the RF component 106 as well as the relatively fragile wirebonds (both 108 and 110), and facilitate easier handling. FIGS. 2A-2I show various stages of a process that can be utilized to form such an overmold structure utilizing compression molding.

Figure 2A:
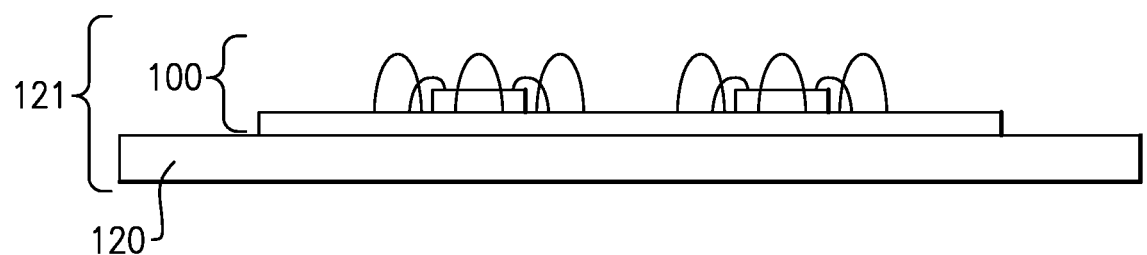
Figure 2B:
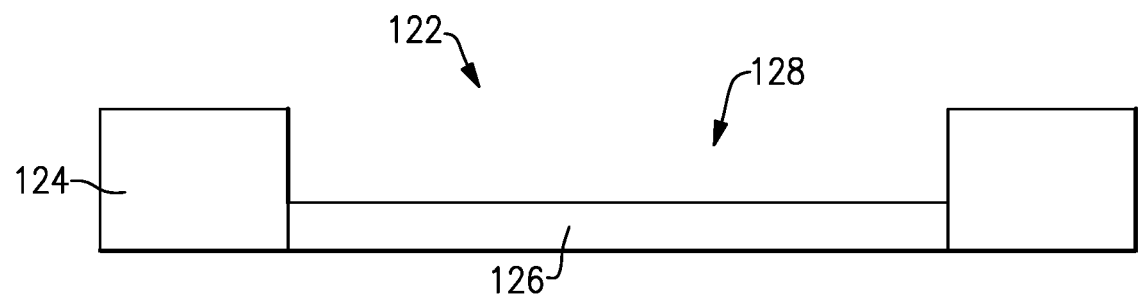

FIG. 2A shows the partially completed panel 100 of FIG. 1 mounted onto an upper molding plate 120 so as to form an assembly 121. In some embodiments, the partially completed panel 100 is partially packaged, or partially protected from environmental conditions. In some embodiments, panel 100 is adhered to upper molding plate 120 with an epoxy, soldered or otherwise affixed to upper molding plate 120. As described herein, such an assembly 121 can be inverted and positioned over a compression molding cavity assembly. FIG. 2B illustrates an example compression molding cavity assembly 122. Such an assembly 121 can include a lower molding plate 124 that defines a mold cavity 128. A movable floor 126 dimensioned to allow vertical movement within the mold cavity 128 can be provided so as to allow reduction in the volume of the mold cavity 128 and thus provide compression molding functionality.

Figure 2C:
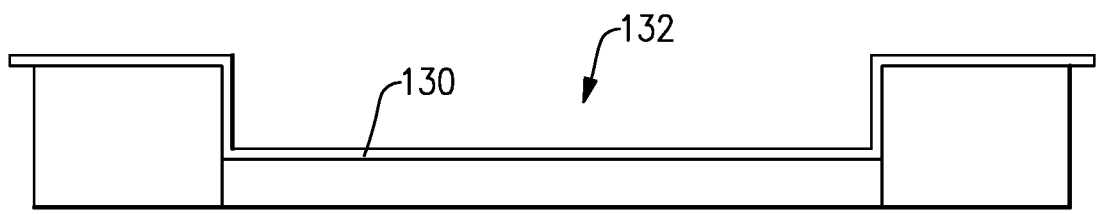

FIG. 2C shows that a release film 130 can be implemented to line some or all of the surface of the mold cavity 128. For example, the release film 130 can cover the side walls and the floor of the mold cavity 128 so as to form a film-lined cavity 132. In some implementations, a release film 130 is used to provide cleaner, easier removal of mold compound or resin deposited within film-lined cavity 132.

Figure 2D:
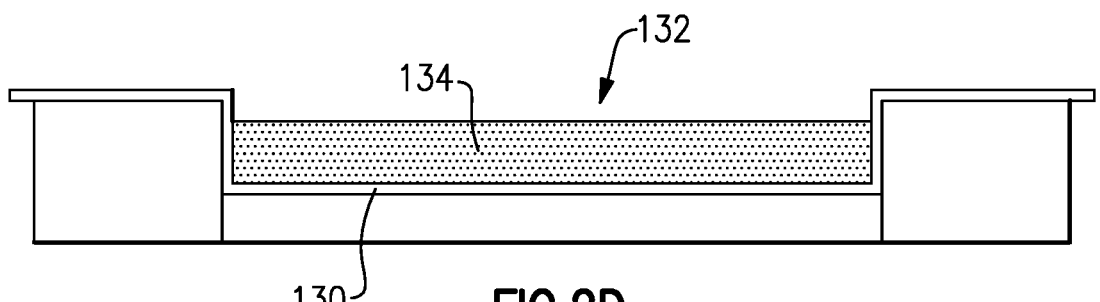
Figure 2E:
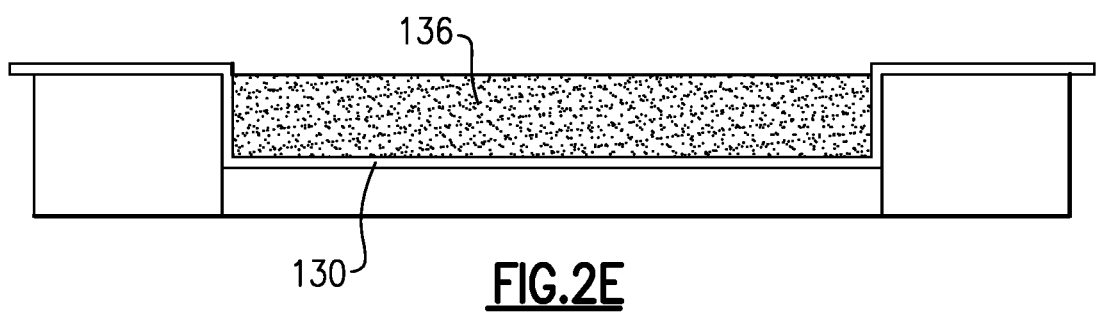
Figure 21:
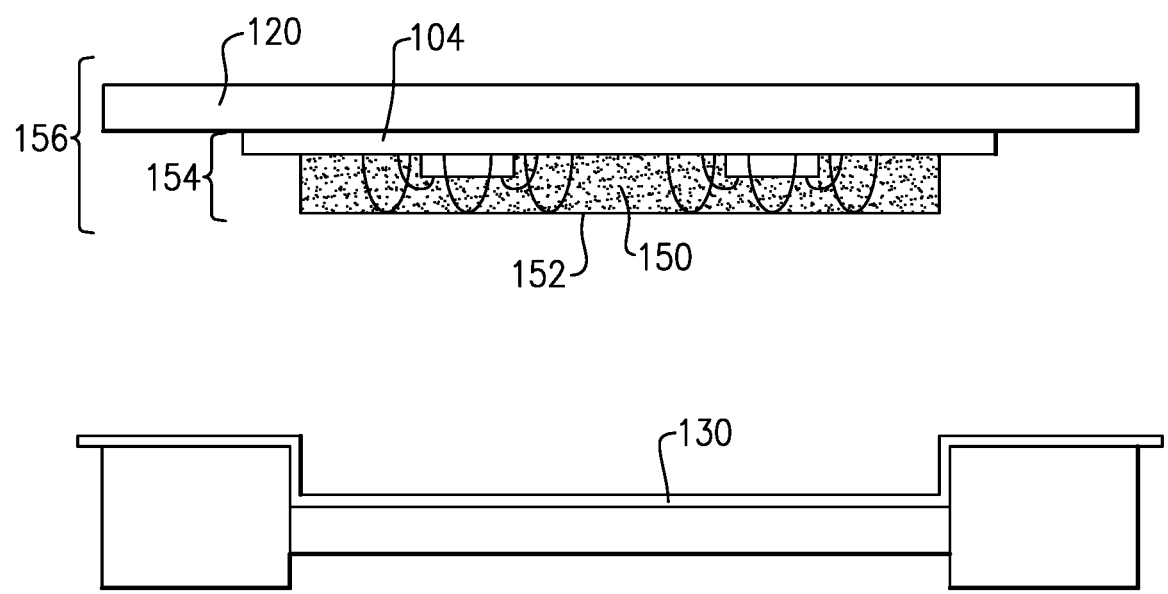

In FIG. 2D, the film-lined cavity 132 is shown to have been filled with thermo-resin material 134. In some embodiments, the thermo-resin material 134 is poured into film-lined cavity 132, and in some embodiments, the thermo-resin material 134 is injected into film-lined cavity 132 with an application of a vacuum or adjustment of pressure. FIG. 2E shows that such thermo-resin material 134 can be heated while in the film-lined cavity 132 so as to yield a volume of melted resin 136. In some embodiments, another material with properties similar to those of thermo-resin material 134, is used in place of material 134. For example, such a substitute material is fluid before a curing or cooling process, and results in a hardened state to protect components of a semiconductor device from environmental elements such as moisture, light and/or heat.

In FIG. 2F, the assembly 121 described in reference to FIG. 2A is shown to be inverted and in the process of being lowered onto the compression molding cavity assembly. Such a lowering can allow the individual units (102 in FIG. 1) to be dipped into the volume of melted resin 136. Preferably, such a lowering motion (depicted as an arrow 140) is performed in an approximately vertical direction so as to reduce or substantially eliminate lateral sweep of the relatively fragile wirebonds (e.g., connection-wirebonds 108 and/or shielding-wirebonds 110 from FIG. 1).

In FIG. 2G, the assembly 121 is shown to be fully lowered onto the compression molding cavity assembly, such that the edge portions of the packaging substrate 104 engage the upper surface of the lower molding plate 124, or release film 130 on the upper surface of lower molding plate 124. Such a configuration can allow the film-lined cavity (132) with the melted resin 136 to be substantially sealed by the packaging substrate 104, to yield a sealed volume 142. Upon formation of such a sealed volume, vacuum (e.g., air suction) can be applied (depicted as an arrow 144) to facilitate the compression molding process.

FIG. 2H shows such a compression molding being performed by the floor 126 being moved upward (depicted as an arrow 146), so as to yield a reduced volume of resin 150. During such a compression process, in some embodiments, the vacuum 144 continues to be applied.

In the example of FIG. 2H, the upward movement of the floor 126 can be selected so that the release film (130) engages the shielding-wirebonds (110). Such a configuration can allow appropriate portions of the shielding-wirebonds to be exposed, or become exposed relatively easily, when the compression molding process is completed. An example of how the release film can accommodate such exposure of the shielding-wirebonds is described in greater detail in reference to FIG. 3.

Still referring to FIG. 2H, it is also noted that the upward movement of the floor 126 can also reduce the likelihood of significant lateral motion of the resin being compression molded. Accordingly, such an upward motion of the compression mechanism can facilitate reduction or substantial elimination of lateral sweep of the relatively fragile wirebonds (e.g., connection-wirebonds 108 and/or shielding-wirebonds 110 from FIG. 1). An additional benefit of the compression of the resin, is the significant reduction or elimination of air pockets within reduced volume of resin 150.

FIG. 2I shows an example stage where the compression molding process of FIG. 2H has been completed, and where the compression molded structure 150 has cured sufficiently to be separated from the release film 130. The compression molded structure 150 now forms an overmold structure for the packaging substrate 104, and such an assembly is indicated as 154.

In the example of FIG. 2I, the assembly 154 of the packaging substrate 104 and the overmold structure 150 is shown to remain attached to the upper molding plate 120 so as to form an assembly 156. Further processing of the packaging substrate/overmold structure assembly 154 can be achieved in such a form (assembly attached to the upper molding plate), with the assembly 154 removed from the upper molding plate 120, or any combination thereof.

As described herein, such further processing of the packaging substrate/overmold structure assembly 154 can include formation of a conductive layer on a surface 152 of the overmold structure 150 to facilitate RF shielding functionality of the resulting modules.

Figure 3:
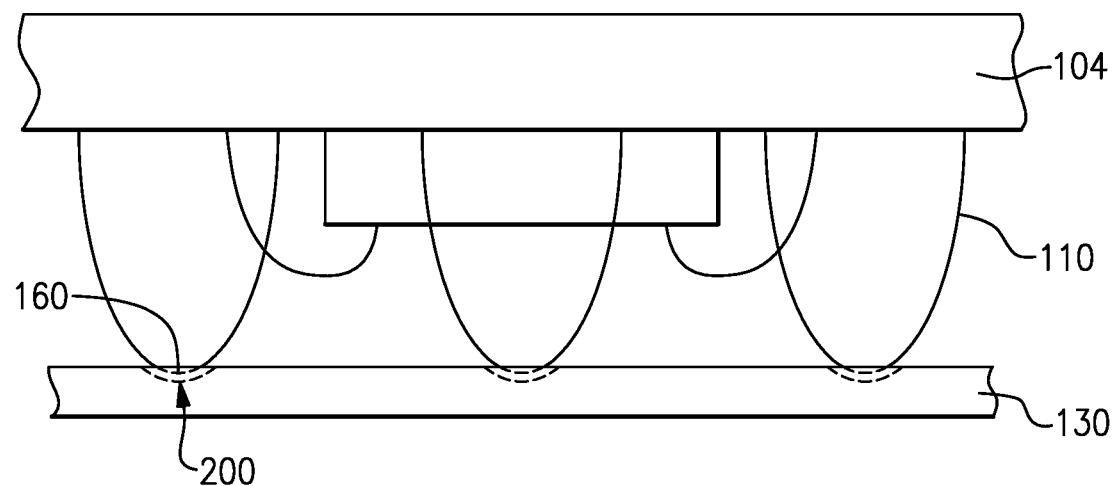
FIG. 3 shows a closer view of the example stage of FIG. 2H in accordance with some implementations.

FIG. 3 shows a closer view of the example stage of FIG. 2H. In FIG. 3, it will be assumed that the resin is present between the packaging substrate 104 and the release film 130. As described in reference to FIG. 2H, the upward movement of the floor (126) can be achieved so that the release film 130 engages the shielding-wirebonds (110). In FIG. 3, an example of such an engagement between the release film 130 and the shielding-wirebonds 110 is shown with more detail.

In some embodiments, the release film 130 can be selected to provide sufficient deformation upon engagement with the shielding-wirebonds 110. In the example of FIG. 3, the upper portions 160 of the shielding-wirebonds 110 (in an inverted orientation) are shown to engage the surface of the release film 130 and form slight deformations 200 at the engagement locations. Such slight deformations 200 of the release film 130 can provide a number of functionalities. For example, the shielding-wirebonds 110 can be held in such an engaged position to thereby reduce lateral movement during the compression molding process. In another example, the upper portions 160 being positioned within the deformed portions 200 of the release film 130 can allow such upper portions 160 to remain exposed from the resulting overmold structure (150). Even if the heights of the upper portions 160 of the various shielding-wirebonds 110 are not precisely uniform (e.g., from the packaging substrate 104), the foregoing engagement of some or all of the upper portions 160 of the shielding-wirebonds 110 with the release film 130 (e.g., some may deform the release film deeper than others, or some may not be tall enough to physically contact the release film) can make it easier to expose substantially all of the upper portions 160 from the resulting overmold structure (150).

Figure 4A:
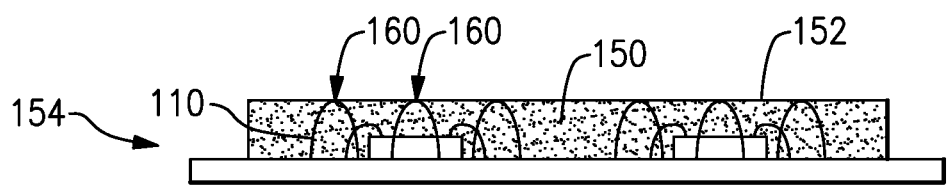
FIGS. 4A and 4B show side and plan views of the assembly resulting from the example stage 2I, inverted to be in an upright orientation in accordance with some implementations.
Figure 4B:
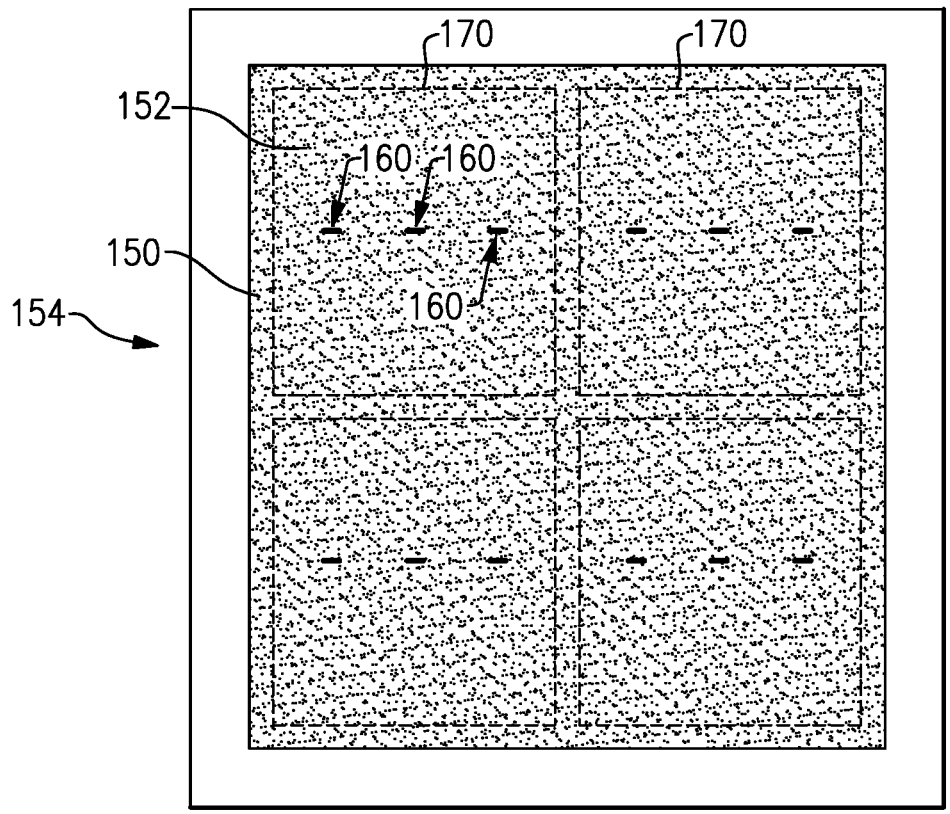

FIGS. 4A and 4B show side and plan views of the assembly 154 resulting from the example stage 2I, inverted to be in an upright orientation. As described herein, the upper surface 152 of the resulting overmold structure 150 can expose the upper portions 160 of the shielding-wirebonds 110. In situations where some or all of the upper portions 160 are not sufficiently exposed for an effective electrical connection, an upper portion of the overmold structure 150 can be removed to sufficiently expose some or all of the upper portions 160 of the shielding-wirebonds 110. Such removal of the upper portion of the overmold structure 150 can be achieved by, for example, ablation techniques. Among others, examples related to such ablation techniques are described in Appendix B of U.S. Provisional Application No. 62/168,872 filed May 31, 2015, entitled SHIELDED MODULE HAVING COMPRESSION OVERMOLD, which is expressly incorporated by reference in its entirely, and which is to be considered part of the specification of the present application.

In the plan view of FIG. 4B, the upper portions 160 of the shielding-wirebonds (110, now mostly buried within the overmold structure 150) are shown to be exposed on the upper surface 152 of the overmold structure 150). FIG. 4B also shows how an array of individual units (depicted as 170) can be processed together in a panel format, sharing a common packaging substrate and a common overmold structure.

Figure 5:
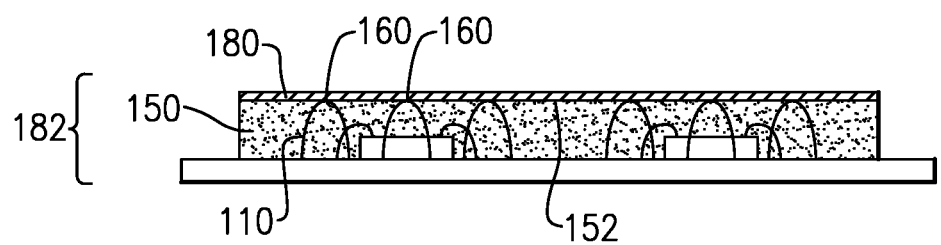
FIG. 5 shows that a conductive layer can be formed on the upper surface of the overmold structure, so as to form an assembly in accordance with some implementations.

FIG. 5 shows that a conductive layer 180 can be formed on the upper surface 152 of the overmold structure 150, so as to form an assembly 182. Such a conductive layer 180 can be in electrical contact with the shielding-wirebonds 110 through their exposed upper portions 160. As described herein, the shielding-wirebonds 110 can be electrically connected to a ground plane on or within the packaging substrate.

In some embodiments, the conductive layer 180 can be a metal or metal-based layer, and such a layer can be formed by, for example, spray-painting or other deposition techniques. Examples related to such a conductive layer can be found in Appendix B of U.S. Provisional Application No. 62/168,872 filed May 31, 2015, entitled SHIELDED MODULE HAVING COMPRESSION OVERMOLD, which is expressly incorporated by reference in its entirely, and which is to be considered part of the specification of the present application.

Figure 6:
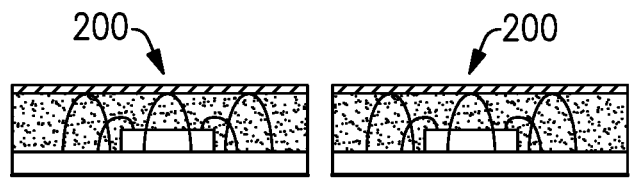
FIG. 6 shows an example stage where individual units result from singulation of the assembly of FIG. 5 in accordance with some implementations.

FIG. 6 shows an example stage where individual units 200 result from singulation of the assembly 182 of FIG. 5. In some embodiments, such singulation can be achieved by, for example, sawing, cutting, dicing, etc. Each of the individual units 200 can be a substantially complete packaged RF module having shielding capability. As described herein, such a packaged RF module can be installed on a circuit board such as a phone board.

Figure 7A:
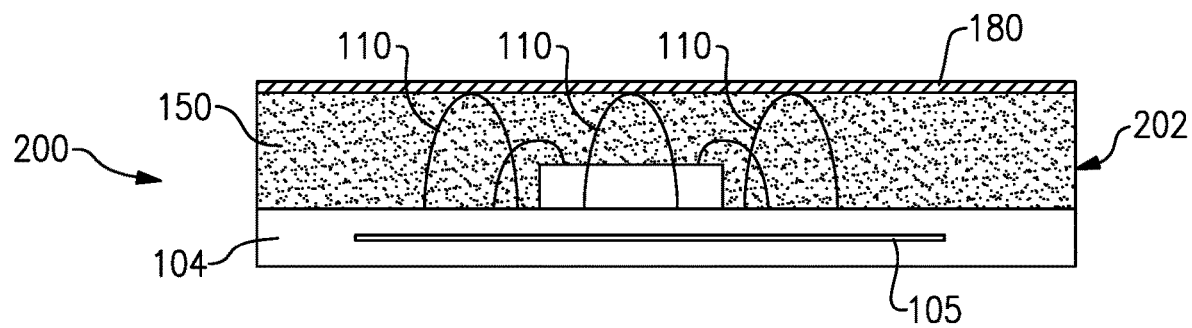
FIG. 7A shows a side view of a packaged module with shielding-wirebonds each having symmetric arch shapes in accordance with some implementations.
Figure 7B:
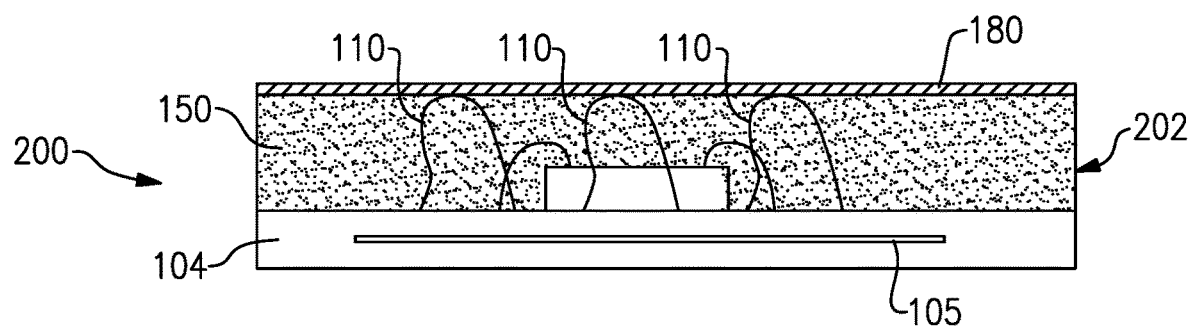
FIG. 7B shows a side view of a packaged module with shielding-wirebonds each having an asymmetric arch shape in accordance with some implementations.
Figure 7C:
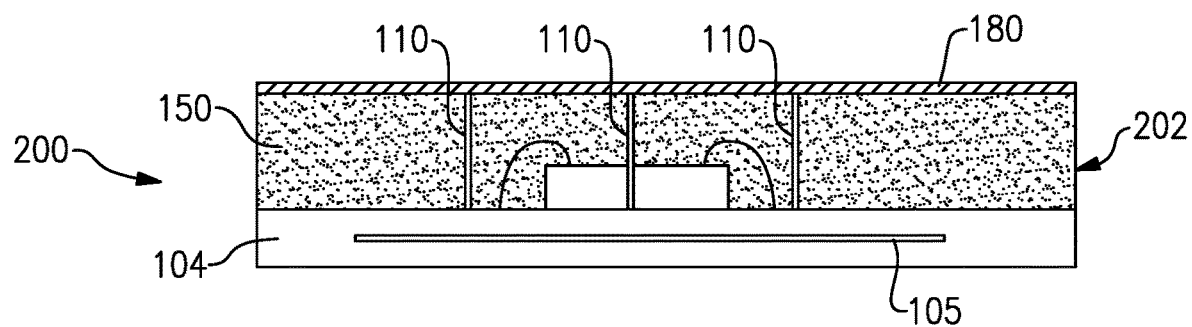
FIG. 7C shows a side view of a packaged module with shielding-wirebonds each having a single wire connecting a packaging substrate to a conductive layer in accordance with some implementations.

In the various examples described herein in reference to FIGS. 1-6, the shielding-wirebonds 110 are depicted as having a generally symmetric arch shape. FIGS. 7A-7C show that other shaped shielding-wirebonds can be utilized.

In FIGS. 7A-7C, an individual packaged RF module 200 is shown in a state similar to the example of FIG. 6. Accordingly, one or more shielding-wirebonds 110 can provide an electrical connection between a conductive layer 180 on the overmold structure 150 and a ground plane 105 within or on the packaging substrate 104. Such a configuration can provide an effective shielding functionality for the packaged RF module 200.

In the example of FIG. 7A, each of the shielding-wirebonds 110 can have a generally symmetric arch shape. In the example of FIG. 7B, each of the shielding-wirebonds 110 can have an asymmetric arch shape. In the example of FIG. 7C, each of the shielding-wirebonds 110 can be a single wire with one end on the packaging substrate 104 and the other end in electrical contact with the conductive layer 180.

As described herein, a packaged RF module 200 can include a packaging substrate 104, and a compression-molded overmold structure 150. Such an overmold structure 150 can include one or more singulated edges resulting from singulation of a plurality of individual units processed together in a panel format. The overmold structure 150 can advantageously encapsulate one or more RF components and shielding-wirebonds therein.

Figure 8:
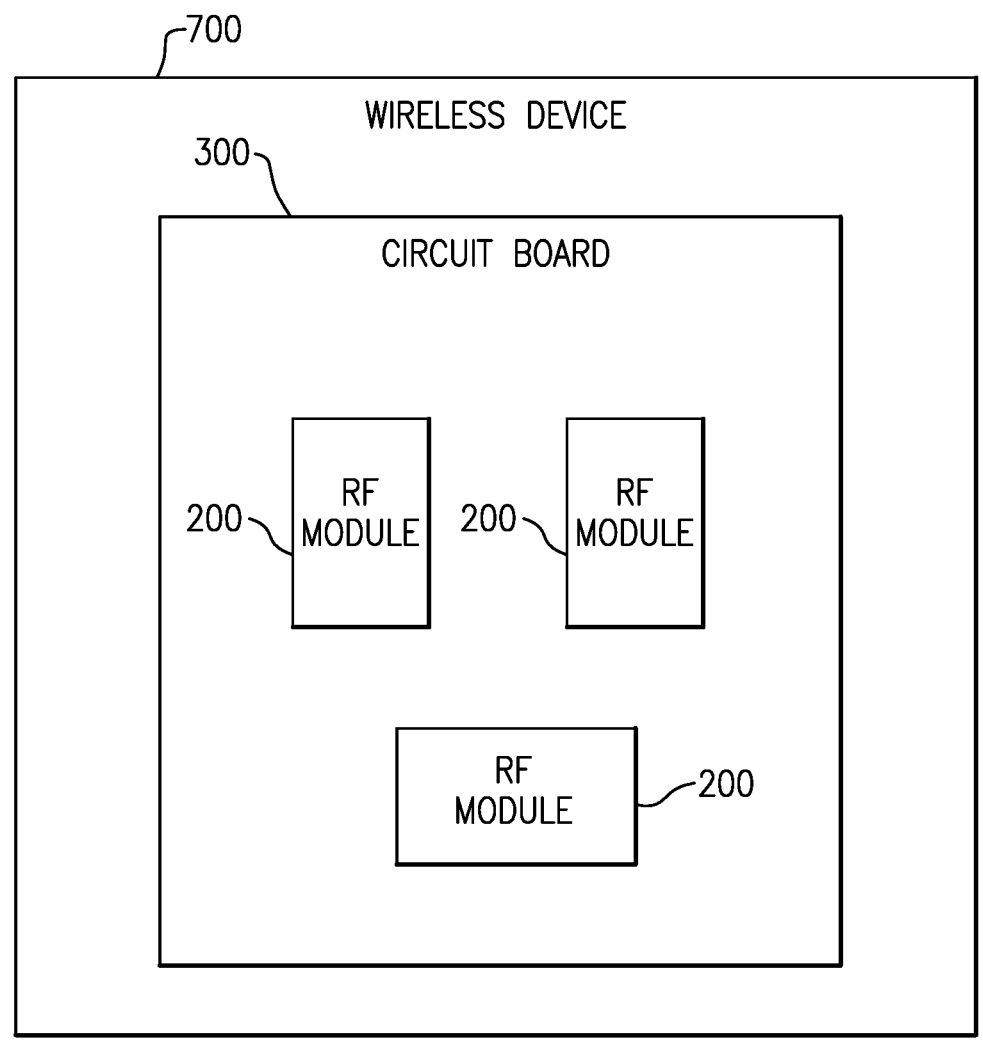
FIG. 8 shows one or more packaged RF modules each mounted on a circuit board in accordance with some implementations.

FIG. 8 shows that one or more packaged RF modules 200 each having one or more features as described herein can be mounted on a circuit board 300 such as a phone board. Such a circuit board can be utilized in a wireless device 700 such as a cellular phone. Additional details concerning such a wireless device are described herein in reference to FIG. 9.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 9:
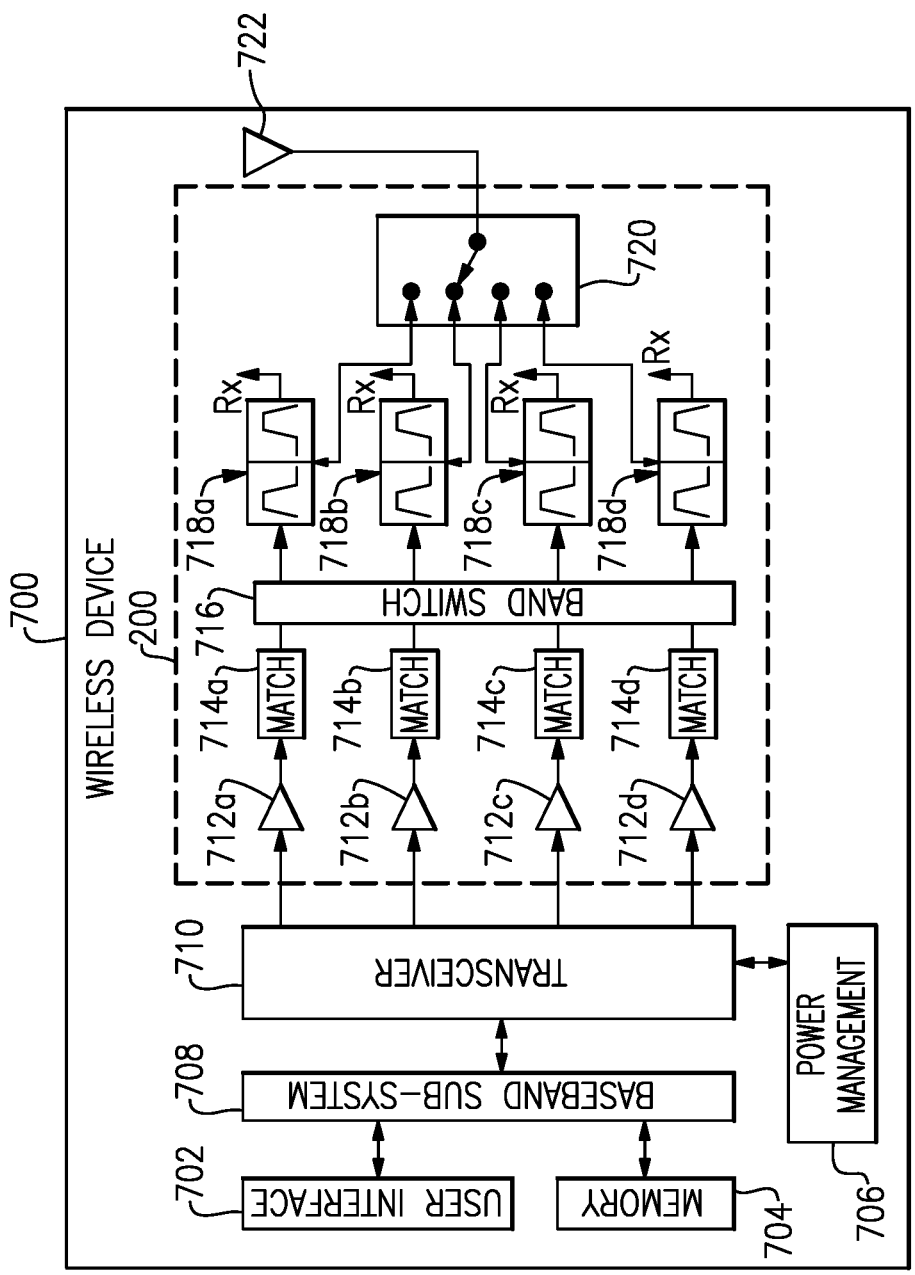
FIG. 9 shows an example wireless device implementing one or more packaged modules in accordance with some implementations.

FIG. 9 depicts an example wireless device 700 having one or more advantageous features described herein. In the context of a module having one or more features as described herein, such a module can be generally depicted by a dashed box 200, and can be implemented as a front-end module (FEM). Other modules in the wireless device 700 can also benefit from implementation of one or more features as described herein.

PAs 712 can receive their respective RF signals from a transceiver 710 that can be configured and operated to generate RF signals to be amplified and transmitted, and to process received signals. The transceiver 710 is shown to interact with a baseband sub-system 708 that is configured to provide conversion between data and/or voice signals suitable for a user and RF signals suitable for the transceiver 710. The transceiver 710 is also shown to be connected to a power management component 706 that is configured to manage power for the operation of the wireless device. Such power management can also control operations of the baseband sub-system 708 and the module 200.

The baseband sub-system 708 is shown to be connected to a user interface 702 to facilitate various input and output of voice and/or data provided to and received from the user. The baseband sub-system 708 can also be connected to a memory 704 that is configured to store data and/or instructions to facilitate the operation of the wireless device, and/or to provide storage of information for the user.

In the example wireless device 700, outputs of the PAs 712 are shown to be matched (via respective match circuits 714) and routed to an antenna 722 through a band selection switch 716, their respective duplexers 718 and an antenna switch 720. In some embodiments, each duplexer 718 can allow transmit and receive operations to be performed simultaneously using a common antenna (e.g., 722). In FIG. 9, received signals are shown to be routed to "Rx" paths (not shown) that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for fabricating a radio-frequency module, the method comprising:
   forming or providing a first assembly that includes a packaging substrate and a radio-frequency component mounted thereon, the first assembly further including one or more shielding-wirebonds formed relative to the radio-frequency component;
   forming an overmold over the packaging substrate to substantially encapsulate the radio-frequency component and the one or more shielding-wirebonds, the overmold formed by compression molding; and
   forming a conductive layer on an upper surface of the overmold such that the conductive layer is in electrical contact with some or all of the shielding-wirebonds.

2. The method of claim 1 wherein the compression molding further includes reducing a volume of melted resin in a direction having a component perpendicular to a plane defined by the packaging substrate.

3. The method of claim 2 wherein the forming of the overmold includes mounting the first assembly to an upper molding plate to yield a second assembly in which the radio-frequency component and the one or more shielding-wirebonds are facing downward of the upper molding plate.

4. The method of claim 3 wherein the forming of the overmold further includes lining a molding cavity with a release film.

5. The method of claim 4 wherein the forming of the overmold further includes lowering the second assembly into the molding cavity having the volume of melted resin.

6. The method of claim 5 wherein the lowering of the second assembly includes a substantially vertical motion to reduce or eliminate lateral sweeping of the one or more shielding-wirebonds.

7. The method of claim 5 wherein the forming of the overmold further includes applying vacuum to the volume of melted resin.

8. The method of claim 7 wherein the vacuum remains applied during at least a portion of the reduction of the volume of melted resin.

9. The method of claim 5 wherein the reducing of the volume of melted resin includes moving a floor of the molding cavity upward by an amount resulting in a portion of the one or more shielding-wirebonds engaging the release film.

10. The method of claim 9 wherein the portion of the one or more shielding-wirebonds deforms the release film upon the engagement to thereby reduce lateral movement of the one or more shielding-wirebonds during the reduction of the volume of melted resin.

11. The method of claim 5 wherein the forming of the overmold further includes separating the second assembly from the molding cavity, the separated second assembly including the compression molded overmold.

12. The method of claim 11 further comprising removing the first assembly with the compression molded overmold from the upper molding plate.

13. The method of claim 1 wherein forming the conductive layer includes depositing a metal-based layer on the upper surface of the overmold.

* * * * *